(12) United States Patent
Murade

(10) Patent No.: US 6,724,513 B2
(45) Date of Patent: Apr. 20, 2004

(54) ELECTRO-OPTIC DEVICE AND ELECTRONIC INSTRUMENT

(75) Inventor: Masao Murade, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/355,223

(22) Filed: Jan. 31, 2003

(65) Prior Publication Data

US 2003/0222261 A1 Dec. 4, 2003

(30) Foreign Application Priority Data

Feb. 12, 2002 (JP) ........................................ 2002-034696
Nov. 29, 2002 (JP) ........................................ 2002-348047

(51) Int. Cl.[7] .............................. G02F 1/03; G02F 1/07
(52) U.S. Cl. ......................... 359/245; 359/250; 359/252
(58) Field of Search ................................. 359/245, 247, 359/250–52, 254, 255, 315

(56) References Cited

U.S. PATENT DOCUMENTS 6,660,549 B2 * 12/2003 Yamazaki et al. ............ 438/30
2002/0014627 A1 * 2/2002 Sato ............................ 257/66
2003/0155588 A1 * 8/2003 Murade ....................... 257/213

* cited by examiner

*Primary Examiner*—Jordan M. Schwartz
*Assistant Examiner*—Jessica Stultz
(74) *Attorney, Agent, or Firm*—Oliff & Berridge, PLC

(57) ABSTRACT

An electro-optic device has, on a TFT array substrate, a pixel electrode; a TFT connected thereto; a scanning line and a data line connected to the thin film transistor; a pixel potential side capacitance electrode that is connected to the pixel electrode and constitutes a storage capacitor; and a capacitance line that contains a fixed potential side capacitance electrode that is disposed oppositely via a dielectric film to the pixel potential side capacitance electrode and constitutes the storage capacitor. A width W1 of a portion that projects along the data line in the capacitance line is formed the same as or wider than a width W2 of the data line. Thereby, while realizing a lower resistance capacitance line, or an inhibition of an occurrence of a light leakage current in a TFT, an enhancement of an open area ratio can be satisfied.

17 Claims, 12 Drawing Sheets

ELECTRO-OPTIC DEVICE AND ELECTRONIC INSTRUMENT

BACKGROUND OF THE INVENTION

1. Field of Invention

The present invention relates to an electro-optic device that may be used in an electro-optic device, such as an active matrix drive liquid crystal device, for example. The invention also relates to an electronic instrument provided with the electro-optic device.

2. Description of Related Art

In the related art, an electro-optic device includes a pair of substrates with an electro-optic material, such as liquid crystal, interposed therebetween, and electrodes that are disposed on each of the two of substrates to apply an electric field to the electro-optic material. The electrodes are used to apply an electric field to the electro-optic material and thereby to appropriately alter a state of the electro-optic material. According to this electro-optic device, when light enters the electro-optic device from, for instance, a light source and a state of the electro-optic material is appropriately altered as mentioned above, the transmittance of the light can be controlled, and thereby image display can be realized.

One type of such an electro-optic device is provided such that, when one of the two substrates is provided with pixel electrodes arranged in matrix as the electrode, thin film transistors (hereinafter "TFT") connected to each of the pixel electrodes, and scanning lines and data lines that are connected to each of the TFTs and arranged in parallel with a row and column direction, respectively, so-called active-matrix drive can be realized. Thereby, when a voltage applied to the electro-optic material is controlled for each of the pixel electrodes, or for each of the pixels divided by the scanning lines and the data lines, light transmittance can be controlled for each of the pixels.

Furthermore, in order to display a higher quality image, the electro-optic device can be provided with various configurations other than the above. For instance, typically, a storage capacitor that is formed of a pixel potential side capacitance electrode connected to the pixel electrode and the TFT and a fixed potential side capacitance electrode disposed opposite via a dielectric film to the pixel potential side capacitance electrode can be provided. This is used to hold a voltage applied to an electro-optic material for a predetermined period of time.

SUMMARY OF THE INVENTION

However, the following problems are present in the related art electro-optic device. In the electro-optic device as mentioned above, there is a universal demand in that in order to display a brighter image, an area occupied, on the substrate, by the scanning lines and the data lines or the storage capacitors, is made to be smaller, thereby a light transmission region, that is a region where a light that contributes in an actual image display in each of the pixels exits due to transmission or reflection is enlarged, and thereby an open area ratio is enhanced. In addition, in order to attain power saving, higher definition or miniaturization of the electro-optic device is simultaneously demanded. From these points of view, there is a general demand that the various kinds of constituent elements be miniaturized.

It is particularly problematic that to increase the open area ratio, a capacitance line constituting the storage capacitor also has to be miniaturized. When a width of wiring is narrowed to make the capacitance line fine, the resistance of the capacitance line becomes higher, resulting in a larger time constant of the wiring. Thereby, cross-talk or burn-in is caused. In the related art, the pixel potential side capacitance electrode that constitutes the storage capacitor is, in some examples, formed of polysilicon, tungsten silicide (WSi) or the like. However, since these materials are not necessarily low-resistance, the above problem is profoundly problematic.

As mentioned above, when each of the constituent elements is miniaturized and narrowed, sufficient attention has to also be paid to a light incidence on the TFT. That is, because when a light is incident on a channel region of a semiconductor layer that constitutes the TFT, light leakage current is caused, and thereby flicker is generated on an image, resulting in deteriorating the image quality. In particular, when the electro-optic device is used as a light valve in a projection type display device, since a light emitted from a very powerful light source is projected on the light valve, light is even more liable to enter the TFT and to cause a problem.

In the related art, in order to inhibit such light from entering the TFT, the TFT or the like is not formed on one of the two substrates, and a light shielding layer is disposed thereon. However, according to this structure, since a distance between the light shielding layer and the TFT becomes relatively larger, an effective shielding function for an obliquely entering light cannot be expected. In order to address or overcome this, the light shielding layer may be formed to be wider. However, this causes a decrease in the open area ratio. That is, the above-mentioned general demand or problems are almost impossible to address or overcome.

Furthermore, in order to inhibit light from entering the TFT, other than the above, a structure can be provided to utilize the data line as a light shielding layer. However, according to this structure, in order to decrease a signal transmission loss by as small a degree as possible, the data line is generally made of a low resistance material, such as, for instance, aluminum, accordingly the higher light reflectance thereof becomes problematic. This is because it is considered that according to such a structure, light that directly enters a surface on an incidence side of the data line can be certainly shielded, but the light reflected from the data line becomes stray light, or the light reflected from the other surface of the data line becomes stray light, resulting in light reaching the TFT. Even in such a structure, when a width of the data line is made to be wider to enhance a light shielding function, similarly to the above light shielding layer, a decrease in the open area ratio may cause a problem, and in view of the above stray light, the stray light may be contrarily increased, resulting in a rather adverse effect in view of inhibiting the light leakage current from occurring.

The present invention addresses the above and/or other problems, and provides an electro-optic device that, while realizing lower resistance of the capacitance line, or reduction or suppression of a light leakage current in the TFT, can address a general demand, such as enhancing an open area ratio. The invention also provides an electronic instrument provided with the electro-optic device.

In order to address or overcome the above problems, an electro-optic device according to the present invention includes, on a substrate; a scanning line; a data line; a thin film transistor disposed in correspondence with an intersection of the scanning line and the date line; a pixel electrode disposed in correspondence with the thin film transistor; a pixel potential side capacitance electrode that is electrically connected to the pixel electrode and constitutes a storage capacitor; and a capacitance line including a fixed potential side capacitance electrode that is disposed opposite via a dielectric film, to the pixel potential side capacitance electrode and constitutes the storage capacitor. In the above, the capacitance line has a body line portion that extends along the scanning line and a portion that extends along the data line. A width of the portion that extends along the data line in the capacitance line is formed the same as a width of the data line or wider than such a width.

According to the electro-optic device of the present invention, when a scanning signal and an image signal are supplied through the scanning line and the data line to the thin film transistor, a pixel electrode can be active matrix driven. Since a storage capacitor that is formed by oppositely disposing the pixel potential side capacitance electrode and the fixed potential side capacitance electrode is connected to the pixel electrode, a voltage of the image signal written in the pixel electrode can be retained for a long period of time.

In particular, in the present invention, since the width of a portion that extends along the data line in the capacitance line is formed the same width that of the data line or wider than such a width, the capacitance line can be made to be even lower in resistance.

Furthermore, in the present invention, as mentioned above, since the capacitance line can be made to be lower in the resistance thereof, from a viewpoint of the entire device, the capacitance line can be made to be narrower, resulting in realizing a narrower storage capacitance. Accordingly, an enhancement in the open area ratio can be attained. When referring to "narrowing the capacitance line", the capacitance line itself can be formed to have the same width as the data line, or "wider than that thereof" Although this could seem contradictory, since the conception of the wider width and narrower width has to be decided according to the relative relationship between the capacitance line and the data line, in view of an entire device, a "narrowing of the capacitance line" can be attained in comparison with the related art device.

When referring to the wider width and narrower width, or "wider" in the present invention, a specific value of the width can be appropriately and preferably determined according to theories, experiments, experiences or simulations.

Furthermore, according to the present invention, not only the resistance can be lowered as mentioned above, but also a light can be inhibited from entering the thin film transistor, in particular a channel region thereof more effectively than in the related art case. That is because, while as mentioned above, in the related art case, light reflected from a rear surface of the data line or the like becomes stray light and results in entering the thin film transistor, according to the present invention, even such stray light is likely to be blocked from proceeding by the capacitance line having the width that is the same with that of the data line or wider than such a width.

From the above, according to the present invention, due to the lower resistance of the capacitance line, a likelihood of causing problems, such as cross-talk or burn-in that is so far problematic, can be lowered. Furthermore, since a light leakage current in the thin film transistor can be reduced or suppressed from being generated, an image of higher quality can be displayed.

In the present invention, due to the presence of a portion that extends along the data line in the capacitance line, an increase in the storage capacitance can be realized. This also largely contributes in displaying an image of higher quality.

In order to allow more effective utilization of the above-mentioned light shielding function, for a material that constitutes the capacitance line, one excellent in the light shielding properties may be applied. For instance, metal elements, alloys, metal silicides, and polysilicides containing at least one of, for instance, Al (aluminum), Cu (copper), Ti (titanium), Cr (chromium), W (tungsten), Ta (tantalum), and Mo (molybdenum), and laminates thereof can be preferably used. In addition to these, a light absorptive material, such as polysilicon, can be also used.

In one exemplary embodiment of the electro-optic device according to the present invention, a periphery of a portion that extends along the data line in the capacitance line overlaps two-dimensionally with a periphery of the pixel electrode, and at least a part of the periphery of the data line does not overlap two-dimensionally with a periphery of the pixel electrode.

According to this exemplary embodiment, firstly, since the periphery of the portion along the data line in the capacitance line overlaps two-dimensionally with the periphery of the pixel electrode, in this portion, light can be shielded from entering the thin film transistor, resulting in reducing the light leakage current.

Furthermore, since at least a part of the periphery of the data line does not overlap two-dimensionally with the periphery of the pixel electrode, a parasite capacitance between the data line and the pixel electrode can be reduced. Accordingly, an adverse effect in which a potential fluctuation of the data line affects on a potential of the pixel electrode can be reduced.

From the above, according to the present exemplary embodiment, finally, quality of the display image can be heightened.

In another exemplary embodiment of the electro-optic device according to the present invention, the capacitance line is provided with, as a portion that extends along the data line, a projected portion that projects from the body line portion along the data line, and a width of the projected portion is formed to be the same as that of the data line or wider than such a width.

According to the exemplary embodiment, by making use of a region where the capacitance line is not present, in a tip end exemplary embodiment the projected portion, for instance, a contact hole that connects data line and a semiconductor layer can be disposed. That is, a degree of freedom in designing an electro-optic device can be increased.

According to still another exemplary embodiment of the present invention, a width of the body line portion in the capacitance line is formed to be wider than that of the scanning line.

According to this exemplary embodiment, even more assuredly than the above, the capacitance line can be lowered in resistance thereof, and light can be inhibited from entering the thin film transistor. In particular, when a part of the scanning line is used as a gate electrode of the thin film transistor, the light leakage current can be even more effectively inhibited from occurring in the thin film transistor. This is because, in a configuration like this, a channel region where a light should be most effectively inhibited from entering is present below the gate electrode. When the width of the capacitance line is made to be wider than that of the scanning line, a light can be more effectively inhibited from entering the channel region.

In the mode, in particular, the periphery of the body line portion in the capacitance line may be formed so as to overlap two-dimensionally with the periphery of the pixel electrode, and at least a part of the periphery of the scanning line may be formed so as not to overlap two-dimensionally with the periphery of the pixel electrode.

According to this configuration, firstly, since the periphery of the body line portion in the capacitance line overlaps two-dimensionally with the periphery of the pixel electrode, light that enters the thin film transistor can be blocked in the portion, resulting in reducing the light leakage current.

Furthermore, since at least a part of the periphery of the scanning line does not overlap two-dimensionally with the periphery of the pixel electrode, a parasite capacitance between the scanning line and the pixel electrode can be reduced. Accordingly, the potential variation in the scanning line can be reduced in adversely affecting on the potential of the pixel electrode.

From the above, consequently, according to the present exemplary embodiment, finally, the display image quality can be enhanced.

According to another exemplary embodiment of the electro-optic device of the present invention, the capacitance line is disposed in a laminated place between a semiconductor layer that constitutes the thin film transistor and the data line.

According to this exemplary embodiment, since the capacitance line is disposed at the laminated place between the semiconductor layer that constitutes the thin film transistor and the data line, light can be inhibited from entering the semiconductor layer more effectively than the above.

In the exemplary embodiment, in particular, a plurality of the pixel electrodes may be formed in a matrix on the substrate, and the capacitance line may be formed so as to be electrically connected to a lower side light shielding film that is disposed with lattice pattern below the thin film transistor and extends in matrix along the scanning line and the data line.

According to this configuration, the operational effect involving the light shield can be even more enhanced. The reason for this is that light that enters the thin film transistor is inhibited not only by the capacitance line above the thin film transistor, but also inhibited by a lower side light shielding film disposed below the thin film transistor.

Furthermore, according to the configuration, even when damage should be partially inflicted on the capacitance line, since the electrically connected lower side light shielding film may exhibit a substitute operation, the capacitance line cannot be easily made to be higher in the resistance. Furthermore, since the lower side light shielding film extends in lattice pattern along directions of the scanning line and data line, even when any damage or the like is partially inflicted not only on the capacitance line but also on the lower side light shielding film, since many electrically conductive paths can be expected, when the capacitance line is regarded as a whole, it is even more difficult for the capacitance line to become higher in the resistance.

In still another exemplary embodiment of the electro-optic device of the present invention, the capacitance line has, two-dimensionally, a notch portion corresponding to a formation site of the contact hole that electrically connects the pixel electrode and the pixel electrode side capacitance electrode.

According to this exemplary embodiment, an electrical connection between the pixel electrode and the pixel potential side capacitance electrode, regardless of the presence of the capacitance line, can be realized without difficulty, and a requirement ensuing the connection, that is, a decrease of an area of a fixed potential side capacitance electrode that partly constitutes the capacitance line, can be kept to a minimum. Accordingly, the storage capacitance can be maintained to be relatively large.

According to still another exemplary embodiment of the electro-optic device of the present invention, the capacitance line is made of a multi-layered film.

According to this exemplary embodiment, higher functionality of the capacitance line can be realized. That is, for instance, in addition to the function as the fixed potential side capacitance electrode that the capacitance line has, the capacitance line can be provided with other functions. Specifically, in order to address the above problems, when the capacitance line is constituted of a material to obtain a low resistance capacitance line and another material to realize a light shielding function capable of inhibiting light from entering the thin film transistor, the above-mentioned objective can be attained.

As in the invention, when the capacitor line is formed of a multi-layered film, the function as the storage capacitor can be stabilized. That is, for instance, when the above structure is used to realize lower resistance, the capacitance line may be constituted of only one layer of such material. However, in such a case, a function as a capacitor that the storage capacitor should have intrinsically may not be sufficiently fulfilled. By contrast, in the present invention, as mentioned above, since the capacitance line is constituted of a film of two or more layers, even when a material that has any particular function is used in one layer, a material that can work as the storage capacitor can be compensatorily used in another layer. Accordingly, the above-mentioned problems are not caused.

In the exemplary embodiment, particularly, the capacitance line is preferably formed so as to have a film made of a conductive material as an upper layer thereof, and to have a film made of a light absorbing material as a lower layer thereof.

According to this configuration, the capacitance line is allowed to have multi-functionality as described below. Firstly, since an upper layer of the capacitance line is made of a conductive material, metals, such as aluminum, copper, titanium, chromium, tantalum, and molybdenum and others, high electrical conductivity can be attained in the upper layer. In other words, according to the configuration, the narrower capacitance line, that is, the narrower storage capacitance, without further particular restrictions, can be more assuredly realized. From this, cross-talk and burn-in that are caused by the high resistance capacitance line and have been problems in the related art configuration can be more assuredly inhibited from occurring. Furthermore, the fact that the narrower capacitance line can be realized without accompanying a particular problem can largely contribute to enhance the open area ratio.

Since the lower layer of the capacitance line is made of a light absorbing material, such as polysilicon, the so-called stray light that is caused, for instance, when a light, after entering inside of the electro-optic device, is reflected by a lower surface of the data line can be inhibited in advance from reaching the TFT. That is, a total or part of such stray light is absorbed by the lower layer of the capacitance line. Accordingly, the likelihood of the stray light reaching the TFT can be more assuredly reduced.

According to still another exemplary embodiment of the electro-optic device of the present invention, the data line is formed locally wider in a portion that overlaps with the thin film transistor, and a width of a portion that extends along the data line in the capacitance line is formed to be wider than a portion that is not formed wider in the data line and the same as that of a portion that is formed wider in the data line.

According to this exemplary embodiment, a portion that overlaps with the thin film transistor in the data line is formed to be locally wider. This width of the portion that is formed to be wider is same as that of a portion that extends along the data line in the capacitance line. That is, according to this structure, above the thin film transistor, wider formed data line and capacitance line are formed. Accordingly, a light incident from above the thin film transistor can be more assuredly inhibited from entering.

More specifically, for instance, when the capacitance line is made of a refractory metal or the like, the capacitance line can by itself exhibit light shielding performance of substantially 0.1% in transmittance (2 or more in a value of OD (Optical Density)). However, when the capacitance line is subjected to the silicidation, due to a change in the composition thereof, the light shielding performance may be in some cases deteriorated. In this case, it can occur that the light shielding performance of only more than 0.1% in transmittance can be obtained.

However, in this exemplary embodiment, the data line overlapped with the capacitance line made of the refractory metal like this is also provided. Thus, when a configuration in which the overlapping of the capacitance line and the data line performs the light shielding of the thin film transistor is adopted, the light shielding performance corresponding to a multiplication of the transmittances thereof can be obtained. For instance, when the data line is made of aluminum or the like, the light shielding performance of substantially 0.001% or less in the transmittance (4 or more in the OD value) can be exhibited.

In this exemplary embodiment, in particular, the structure of a width of a portion that extends along the data line in the capacitance line is wider means that it is wider than a width of a portion that is not formed wider in the data line.

According to still another exemplary embodiment of the electro-optic device of the present invention, the data line is formed locally wider in a portion that overlaps with the thin film transistor, and a width of a portion that extends along the data line in the capacitance line is formed wider than that of a portion that is not formed wider in the data line and narrower than that of a portion that is formed wider in the data line.

According to this exemplary embodiment, a portion that overlaps with the thin film transistor in the data line is formed to be locally wider. That is, according to this, above the thin film transistor, wider formed data line and capacitance line are formed. Accordingly, light incident from above the thin film transistor can be more certainly shielded.

In the mode, in particular, a width of a portion that extends along the data line in the capacitance line is formed to be narrower than the data line that is formed wider. That is, in the portion, the data line is formed to be narrower than the capacitance line. Thereby, an increase of the stray light by reflection at the data line can be inhibited for instances, such as, when the data line is formed with, for instance, aluminum that is high in reflectance, and stray light that is generated when an incident light is reflected by some element in the electro-optic device; a return light that returns again to the electro-optic device after a light once exited from the electro-optic device is reflected by some element outside of the electro-optic device; or a return light that a light exited from the other electro-optic device returns to the electro-optic device in a projection type display device, such as a color displayable liquid crystal projector in which a plurality of sets of the electro-optic devices is disposed. This is because a portion that is formed to be wider in the data line is formed narrower in width relative to the capacitance line.

In the exemplary embodiment provided with a data line that is formed to be wider in a portion that overlaps with the thin film transistor like this, the capacitance line is disposed at a laminate position between the thin film transistor and the data line, and the data line, in addition to the portion that overlaps with the thin film transistor, may be formed to be wider in a portion where a contact hole for use in connection to the thin film transistor is disposed.

According to this configuration, even when the capacitance line as the light shielding film cannot be disposed for the contact hole, by forming the data line wider, the lowering in the light shielding performance due to the above can be compensated.

Alternatively, the data line for each of the thin film transistors may be formed to be wider continuously from a portion that overlaps with the thin film transistor up to a portion where the contact hole is disposed.

According to this configuration, the light shielding effect to the thin film transistor can be more assuredly attained.

A portion that is formed to be wider in a portion that overlaps with the thin film transistor and a portion that is formed wider in a portion where the contact hole is disposed may be separately formed wider. When a portion that overlaps with the thin film transistor and a portion where the contact hole is disposed are disposed in proximity to each other, and, as in the exemplary embodiment, formed wider continuously, there is no need of needlessly expanding a region that is formed wider. Accordingly, it is advantageous from a viewpoint of not increasing internal reflection.

According to still another mode of the electro-optic device of the present invention, the electro-optic device further includes the other substrate that is disposed opposite via an electro-optic material to the substrate, and a light shielding film disposed on the other substrate, and the width of the data line and a portion that extends along the data line in capacitance line is formed to be narrower than that of the light shielding film.

According to this exemplary embodiment, when a light is assumed to enter from the other substrate, a structure in which in sequence from an incidence side of the light, the light shielding film, the data line and the capacitance line are laminated can be formed. Here, a width of the former one thereof is wider than those of the latter two. That is, the incident light is shielded by a further wider light shielding film, and only the light transmitted therethrough can reach the data line and the capacitance line. Furthermore, when the light transmitted through the light shielding film reaches the data line and the capacitance line, these data and capacitance lines can be expected to exhibit the light shielding function. In essence, according to this exemplary embodiment, since the light shielding properties of the thin film transistor can be further heightened, the likelihood of occurrence of the light leakage current can be further reduced.

The "light shielding film" in the present exemplary embodiment can be formed in a striped pattern or a lattice pattern so as to thread through a gap between the pixel electrodes, for instance, when the pixel electrodes are arranged in matrix. Furthermore, depending on the case, the light shielding film can be formed into a laminate structure in which a light absorptive material, such as chromium or chromina, and a light reflective material, such as aluminum are laminated.

An electronic instrument according to the present invention includes the electro-optic device (including its various modes) according to the present invention.

According to the electronic instrument of the present invention, due to the inclusion of the electro-optic device according to the present invention, the higher resistance of the capacitance line is not caused, and a light entering the thin film transistor can be reduced or suppressed to be as low as possible. As a result, high quality image displayable by various kinds of electronic instruments, such as a liquid crystal projector, a liquid crystal TV, a portable telephone, an electronic diary, a word processor, a viewfinder type or direct-view type video tape recorder, a work station, a video phone, a POS terminal, and a touch panel, for example, can be realized.

DETAILED DESCRIPTION OF PREFERRED EMBODIMENTS

In the following, exemplary embodiments for carrying out the present invention are explained with reference to the drawings. In the following exemplary embodiment, an electro-optic device of the present invention is applied to a liquid crystal device.

Figure 1:
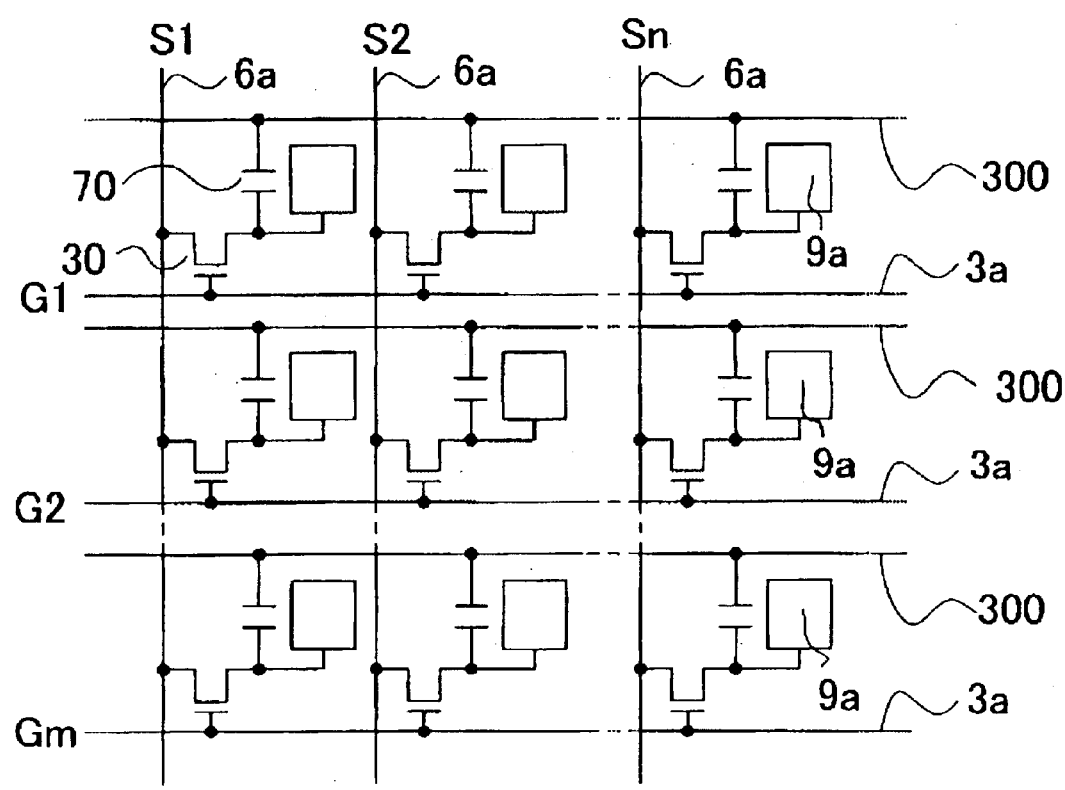
FIG. 1 is a circuit diagram showing an equivalent circuit of various kinds of elements and wirings disposed to a plurality of pixels arranged in matrix that constitutes an image display region in an electro-optic device according to an embodiment of the present invention.
Figure 2:
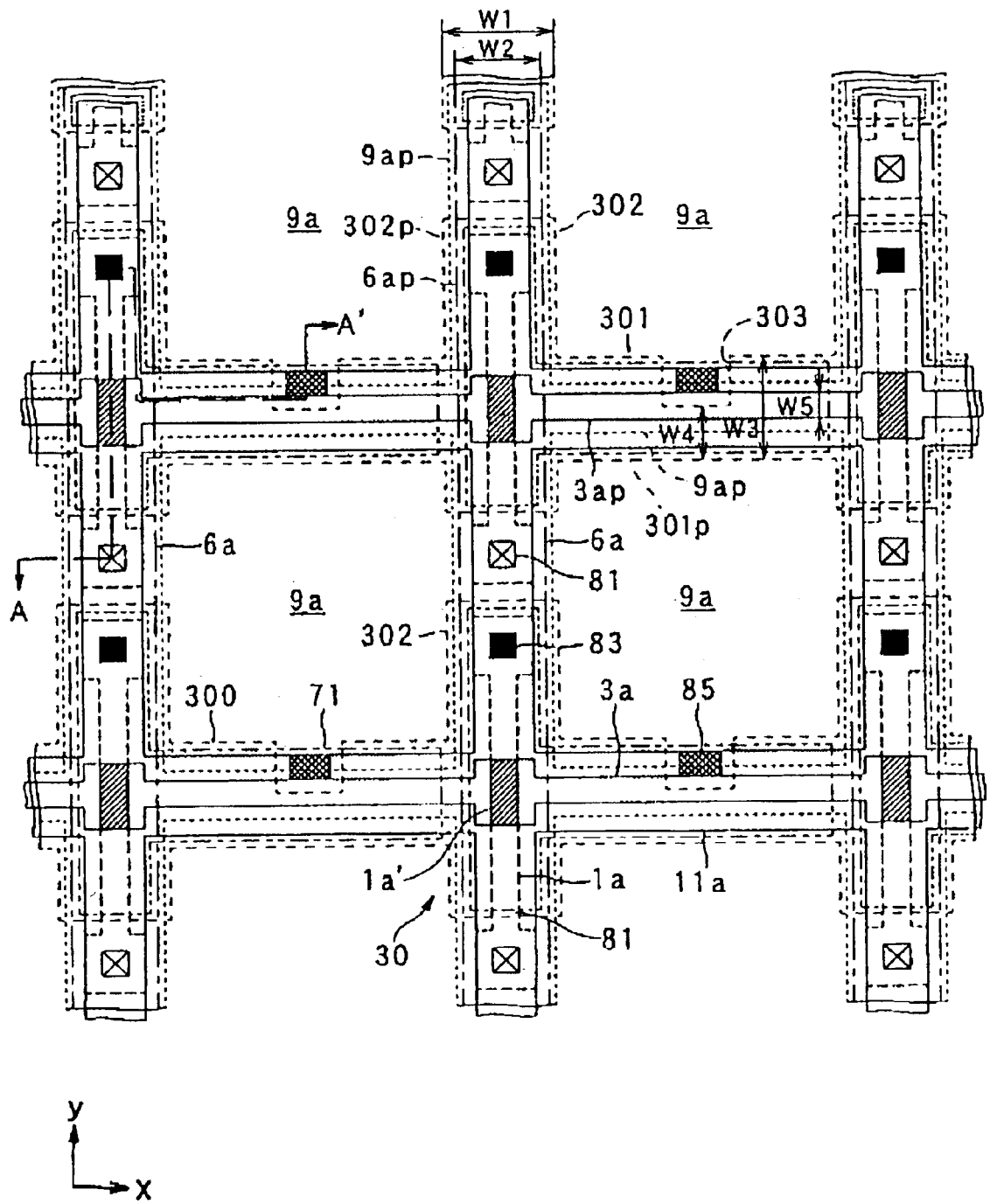
FIG. 2 is a plan view showing a plurality of adjacent pixel groups of a TFT array substrate thereon data lines, scanning lines and pixel electrodes are formed in the electro-optic device according to an embodiment of the present invention.
Figure 3:
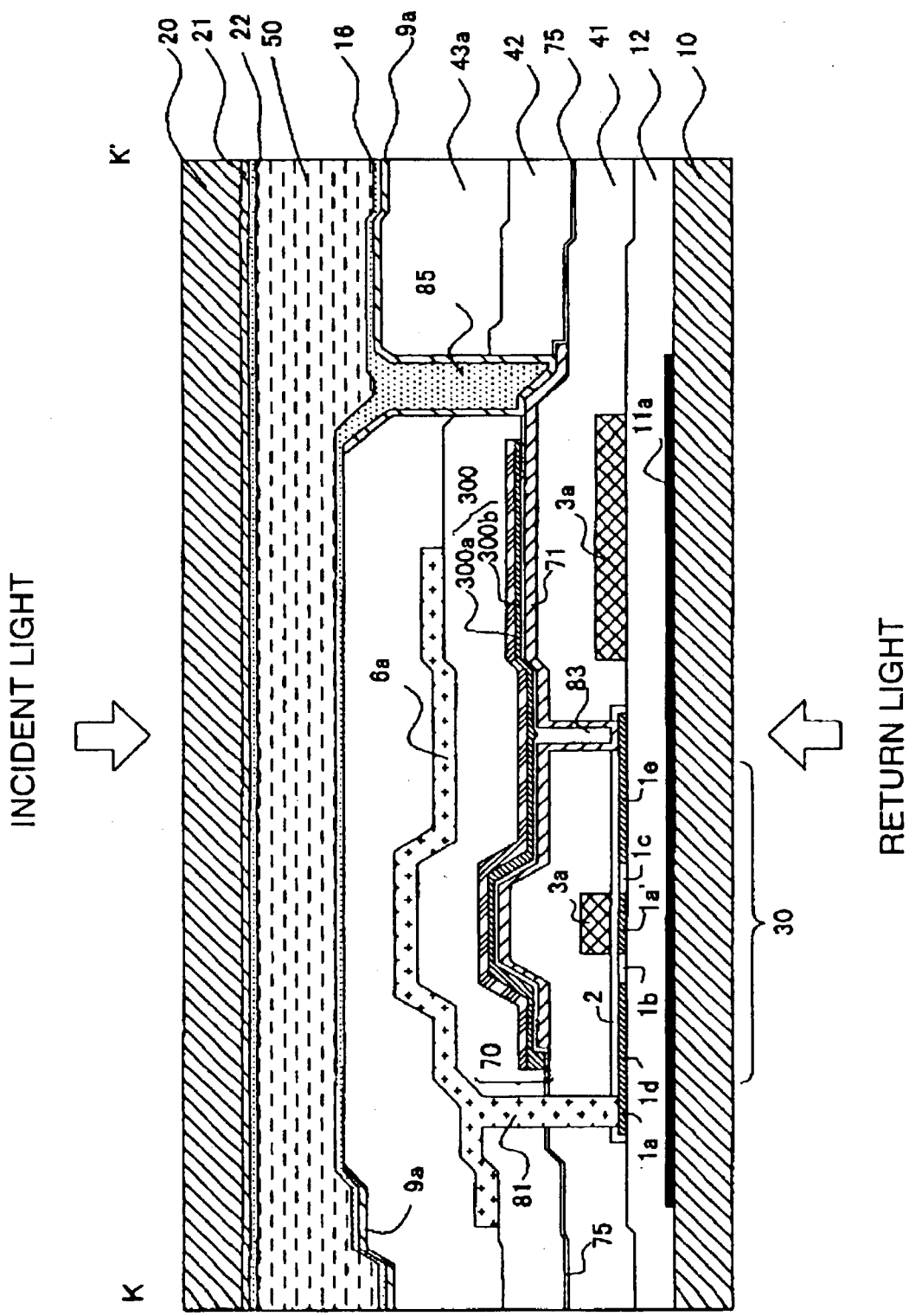
FIG. 3 is a sectional view taken along plane A-A' of FIG. 2.

First, a configuration in a pixel portion of an electro-optic device in an embodiment of the present invention is explained with reference to FIG. 1. FIG. 1 is a schematic showing an equivalent circuit of various kinds of elements and wirings in a plurality of pixels arranged in matrix that constitutes an image display region of the electro-optic device. FIG. 2 is a plan view showing a plurality of adjacent pixel groups of a TFT array substrate thereon data lines, scanning lines, and pixel electrodes are formed. FIG. 3 is a sectional view taken along plane A-A' of FIG. 2. In FIG. 3, in order to make the respective layers and the respective members recognizable on the drawing, scales are differentiated for the respective layers and respective members.

In FIG. 1, in each of a plurality of pixels that is arranged in matrix and constitutes an image display region in an electro-optic device according to the embodiment, a pixel electrode $9a$ and a TFT 30 that switches and controls the pixel electrode $9a$ are formed, and a data line $6a$ thereto an image signal is supplied being electrically connected to a source of the TFT 30. Image signals S1, S2, . . . , Sn to be written in the data line $6a$ may be line sequentially supplied in this order, or may be supplied to a plurality of adjacent data lines $6a$ group by group.

A scanning line $3a$ is electrically connected to a gate of the TFT 30, and scanning signals G1, G2, . . . , Gm, in this order, are line sequentially supplied in pulse to the scanning line $3a$ at a predetermined timing. The pixel electrode $9a$ is electrically connected to a drain of the TFT 30, and when the switching element TFT 30 is switched off for a definite period of time, the image signals S1, S2, . . . , Sn supplied from the data line $6a$ can be written in at a predetermined timing.

The image signals S1, S2, . . . , Sn of predetermined levels, which are written via the pixel electrode $9a$ into a liquid crystal as an example of an electro-optic material, are retained for a definite period of time between the pixel electrode $9a$ and an opposite electrode formed on the opposite substrate. The liquid crystal, according to a level of an applied voltage, varies an orientation or order of molecular groups, thereby a light is modulated, and thereby enabling to display gradation. In a normally white mode, transmittance to an incident light decreases according to a voltage applied to each of the pixels, and in a normally black mode, the transmittance to an incident light increases according to a voltage applied to each of the pixels, and as a whole, a light having contrast corresponding to an image signal is exited from the electro-optic device.

In order to inhibit the retained image signal from leaking, in parallel with a liquid crystal capacitance formed between the pixel electrode $9a$ and the opposite electrode, a storage capacitor 70 is added.

In the following, a more realistic configuration of the electro-optic device in which the above circuit operation is realized by use of the data line $6a$, the scanning line $3a$, the TFT 30 is explained with reference to FIGS. 2 and 3.

First, the electro-optic device according to the embodiment, as shown in FIG. 3 which is a sectional view taken along plane A-A' of FIG. 2, includes a TFT array substrate 10 that is an active matrix substrate, and a transparent opposite substrate 20 disposed opposite thereto. The TFT array substrate 10 is made of, for instance, a quartz substrate, a glass substrate or a silicon substrate, and the opposite substrate 20 is made of, for instance, a glass substrate or a quartz substrate.

As shown in FIG. 3, the TFT array substrate 10 is provided with the pixel electrode $9a$, and above the pixel electrode 9a, an orientation film 16 thereto a predetermined orientation processing, such as a rubbing processing is applied is disposed. The pixel electrode 9a is made of a transparent conductive film, such as an ITO (Indium Tin Oxide) film.

On the other hand, the opposite substrate 20 is provided over an entire surface thereof with an opposite electrode 21, and therebelow an orientation film 22 thereto a predetermined orientation processing, such as the rubbing, is applied is disposed. The opposite electrode 21 is made of a transparent conductive film such as an ITO (Indium Tin Oxide) film.

In FIG. 2, on the transparent TFT array substrate 10 of the electro-optic device, a plurality of pixel electrodes 9a (a contour is shown with a dotted line portion 9a') is disposed in matrix, and along vertical and horizontal boundaries of the pixel electrode 9a, respectively, the data line 6a and the scanning line 3a are disposed.

The scanning line 3a is disposed so as to face a channel region 1a' shown with rightward slanting hatches in FIG. 2 of a semiconductor layer 1a and functions as a gate electrode. That is, at each of intersections between the scanning line 3a and data line 6a, a pixel switching TFT 30 in which a body line portion of the scanning line 3a as a gate electrode, is disposed opposite to the channel region 1a' is disposed.

The TFT 30, as shown in FIG. 3, has an LDD (Lightly Doped Drain) structure, and includes, as constituent elements thereof, the scanning line 3a that functions as the gate electrode as mentioned above, the channel region 1a' of the semiconductor layer 1a that is made of, for instance, a polysilicon film and in which a channel is formed due to an electric field from the scanning line 3a, an insulating film 2 including a gate insulating film that isolates the scanning line 3a and semiconductor layer 1a, and a low concentration source region 1b and a low concentration drain region 1c as well as a high concentration source region 1d and a high concentration drain region 1e in the semiconductor layer 1a.

The TFT 30, though preferably having the LDD structure as shown in FIG. 3, may be formed in an off-set structure in which an impurity is not implanted in the low concentration source region 1b and the low concentration drain region 1c, or may be formed in a self-alignment type TFT in which an impurity is implanted at a high concentration with a gate electrode composed of part of the scanning line 3a as a mask, and thereby a high concentration source region and a high concentration drain region are formed in a self-alignment manner. The present exemplary embodiment is formed in a single gate structure in which only one gate electrode for use in the pixel switching TFT 30 is disposed between the high concentration source region 1d and the high concentration drain region 1e, however, the TFT may be formed in a dual gate structure in which two or more gate electrodes are disposed therebetween or may be formed with triple gates or more. Furthermore, the semiconductor layer 1a that constitutes the TFT 30 may be a non-single crystal layer or a single crystal layer. For the production of the single crystal layer, a related art method, such as a direct wafer bonding method, can be used. When the semiconductor layer 1a is formed of a single crystal layer, in particular a periphery circuit may be formed into one of high functionality.

In FIGS. 2 and 3, a storage capacitor 70 is formed by oppositely disposing a relay layer 71 as a pixel potential side capacitance electrode that is connected to the high concentration drain region 1e and the pixel electrode 9a of the TFT 30, and part of a capacitance line 300 as a fixed potential side capacitance electrode with a dielectric film 75 interposed therebetween. According to the storage capacitor 70, potential retention characteristics in the pixel electrode 9a can be remarkably increased.

The relay layer 71 is made of, for instance, a conductive polysilicon film and functions as the pixel potential side capacitance electrode. However, the relay layer 71 may be formed into a single layer film or a multi-layered film containing a metal or an alloy. The relay layer 71, in addition to a function as the pixel potential side capacitance electrode, has a function of relaying and connecting the pixel electrode 9a and the high concentration drain region 1e of the TFT 30 via contact holes 83 and 85. When the relay layer 71 like this is utilized, even when an interlayer distance is as long as, for instance, substantially 2000 nm, while avoiding technical difficulty of connecting both with one contact hole, both can be favorably connected with two or more serial contact holes having relatively small diameters, and a pixel open area ratio can be heightened. Furthermore, it is also useful in inhibiting the punch through from occurring in the etching when the contact hole is opened.

The dielectric film 75 is made of an insulating film that has a relatively thin film thickness, such as substantially 5 to 200 nm, and contains at least one of TaOx (tantalum oxide), BST (strontium barium titanate), PZT (lead zirconate titanate), $TiO_2$ (titanium oxide), $ZrO_2$ (zirconium oxide), $HfO_2$ (hafnium oxide), $SiO_2$ (silicon oxide), SiON (silicon oxide nitride) and SiN (silicon nitride). In particular, when a high dielectric constant material, such as TaOx, BST, PZT, $TiO_2$, $ZrO_2$ and $HfO_2$, is used, a capacitance value can be increased in a limited region on the substrate. Alternatively, when a material containing silicon such as $SiO_2$ (silicon oxide), SiON (silicon oxide nitride) and SiN is used, stress between the semiconductor layer 1a containing silicon and an interlayer insulating film, such as a first interlayer insulating film 41, can be reduced or suppressed from occurring.

The dielectric film 75 may be formed of a silicon oxide film, such as an HTO (High Temperature Oxide) film and an LTO (Low Temperature Oxide) film, or of a silicon nitride film or the like. In any cases, from a viewpoint of increasing the storage capacitor 70, as far as sufficient reliability of a film can be obtained, the thinner the dielectric film 75 is, the better.

The capacitance line 300, as shown in FIG. 3, is disposed between the semiconductor layer 1a and the data line 6a of the TFT 30, and the capacitance line 300 itself may be formed of a multi-layered film. More specifically, the capacitance line 300, as shown in FIG. 3, is made of two kinds of layers, that is, as an upper layer, an aluminum layer 300a that is an example of a conductive material layer, and as a lower layer, a polysilicon layer 300b that is an example of a layer made of a light absorbing material are laminated.

However, the present invention is not restricted to the material selection like this. That is, as materials constituting the "multi-layered film", in addition to the aluminum and polysilicon, copper, titanium, chromium, tungsten, tantalum, and molybdenum can be properly combined and used, for example. Various kinds of materials cited here are generally excellent in light shielding properties.

The capacitance line 300 like this is formed, as shown in FIG. 2, two-dimensionally superposed on a formation site of the scanning line 3a. More specifically, the capacitance line 300 includes a body line portion 301 that extends along the scanning line 3a, a projection 302 that projects upward along the data line 6a from a position that intersects with the data line 6a in the drawing, and a notch portion 303 in which a portion corresponding to the contact hole 85 constricts slightly.

Of these, the projection 302, by making use of a region above the scanning line 3a and a region below the data line 6a, contributes in an increase of the formation region of the storage capacitor 70. In the embodiment, by forming the projection 302 itself, that is, by intentionally forming a region in which the capacitance line 300 is not present at a tip end of the projection 302, as shown in FIGS. 2 and 3, a contact hole 81 that connects between the data line 6a and the high concentration source region 1e of the semiconductor layer 1a of the TFT 30 can be formed. That is, according to the present embodiment, without causing a problem, such as accompanying a decrease in the pixel open area ratio, a degree of freedom in design can be increased.

Furthermore, due to the presence of the notch portion 303, a connection between the pixel electrode 9a and the relay layer 71 that contains the pixel potential side capacitance electrode, that is, disposition of the contact hole 85, can be realized without difficulty irrespective of the presence of the capacitance line 300. The notch portion 303, as shown in FIG. 2, is sufficient when having "notch" corresponding to a sectional area of the contact hole 85, accordingly the storage capacitor 70 can be maintained relatively large.

In the embodiment, in particular, a width W1 of a portion projected along the data line 6a in the capacitance line 300, that is, the projection 302, is formed the same as that W2 of the data line 6a or wider than that. In FIG. 2, W1>W2. In addition, as to the capacitance line 300 in the present embodiment, portions that extend along the scanning line 3a that is, widths W3 and W4 of a body line portion 301 and the notch portion 303 are larger than the width W5 of the scanning line 3a. That is, W3>W5, and W4>W5.

In addition to the above, in particular in the capacitance line 300 in the embodiment, as shown in FIG. 2, whereas a periphery 302p of the projection 302 is overlapped two-dimensionally with a periphery 9ap of the pixel electrode 9a, on the other hand, at least a part of a periphery 6ap of the data line 6a is not overlapped two-dimensionally with the periphery 9ap of the pixel electrode 9a. Furthermore, similarly to the above, whereas a periphery 301p of the body line portion 301 in the capacitance line 300 is overlapped two-dimensionally with the periphery 9ap of the pixel electrode 9a, on the other hand, at least a part of a periphery 3ap of the scanning line 3a is not overlapped two-dimensionally with the periphery 9ap of the pixel electrode 9a.

The capacitance line 300 is preferably extended from an image display region where the pixel electrode 9a is disposed to the surroundings thereof to electrically connect to a constant potential supply and thereby is set at a fixed potential. As the constant potential supply like this, a constant potential supply of a positive power supply or a negative power supply being supplied to a data line drive circuit may be used, or a constant potential being supplied to the opposite electrode 21 of the opposite substrate 20 may be used.

In the embodiment, on the TFT array substrate 10, from bottom up, the relay layer 71, the dielectric film 75 and the capacitance line 300 are laminated in this order. However, the present invention is not restricted to this exemplary embodiment. For instance, on the contrary to the above, even when the capacitance line 300, the dielectric film 75 and the relay layer 71 are laminated in this order, an operational effect of the invention can be exhibited without suffering any change.

In FIGS. 2 and 3, other than the above, a lower side light shielding film 11a is disposed below the TFT 30. The lower side light shielding film 11a is extended in lattice pattern below the scanning line 3a and the data line 6a, and along the scanning line 3a and the data line 6a. Furthermore, the lower side light shielding film 11a, similarly to the case of the capacitance line 300, may also be extended from the image display region to the surroundings thereof to connect to a constant potential supply in order that a potential fluctuation thereof may not adversely affect on the TFT 30.

Furthermore, below the TFT 30, a primary insulating film 12 is disposed. The primary insulating film 12 has, other than a function of interlayer-insulating the TFT 30 from the lower side light shielding film 11a, a function that, by forming it on an entire surface of the TFT array substrate 10, inhibits roughness in the surface polishing of the TFT array substrate 10, stains remaining after the cleaning from causing characteristics change of the pixel switching TFT 30.

In addition to the above, on the scanning line 3a, a first interlayer insulating film 41 is formed, in which a contact hole 81 extending to the high concentration source region 1d and a contact hole 83 extending to a high concentration drain region 1e are bored.

On the first interlayer insulating film 41, the relay layer 71 and the capacitance line 300 are formed, and further thereon a second interlayer insulating film 42 is formed, in which the contact hole 81 extending to the high concentration source region 1d and the contact hole 85 extending to the relay layer 71 are bored.

In the embodiment, the first interlayer insulating film 41 may be subjected to a baking at substantially 1000 degree centigrade to activate an ion implanted into a polysilicon film that constitutes the semiconductor layer 1a or the scanning line 3a. On the other hand, in the second interlayer insulating film 42, without subjecting to the baking like this, stress caused in the neighborhood of a boundary of the capacitance line 300 may be relieved.

On the second interlayer insulating film 42, the data line 6a is formed, and further thereon a third interlayer insulating film 43, therein the contact hole 85 continuing to the relay layer 71 is formed, is formed. A surface of the third interlayer insulating film 43 is planarized by use of CMP (Chemical Mechanical Polishing) processing to decrease orientation irregularities of the liquid crystal layer 50 due to steps of various kinds of wirings and elements present thereunder. However, instead of planarizing the third interlayer insulating film 43, or in addition to this, by digging a groove in at least one of the TFT array substrate 10, the substrate insulating film 12, the first interlayer insulating film 41 and the second interlayer insulating film 42 to bury the wirings, such as the data line 6a and the TFT 30, and thereby the planarization may be applied.

In the electro-optic device according to the embodiment configured as explained above, since a width of the projection 302 of the capacitance line 300 is formed wider than that of the data line 6a, and widths of the body line portion 301 and the notch portion 303 are formed wider than that of the scanning line 3a, the following operational effects can be realized.

Firstly, in comparison with the related art device, the capacitance line 300 can be made lower in the resistance. Thereby, likelihood of problems such as cross-talk and burn-in that are caused by higher resistance of the capacitance line and are problematic in the related art can be reduced. Furthermore, such lower resistance of the capacitance line 300, in view of an entire device, enables to obtain a narrower capacitance line 300, that is, a narrower storage capacitance 70, resulting in enhancing the pixel open area ratio.

Furthermore, light incident on the TFT 30, in particular, on the channel region 1a' thereof can be effectively inhibited even more. This is because, as mentioned above, light that is reflected at a rear surface of the data line 6a becomes a stray light, and in some cases, results in entering the TFT 30 in the related art. However, according to the present embodiment, even when there is such stray light, due to the capacitance line 300 that is formed the same in width as that of the data line 6a or larger than that, the likelihood of blocking the proceeding thereof becomes higher.

Such an operational effect involving the light shield to the TFT 30 can be more effectively accomplished by employing the following in the present embodiment, such as the widths of the body line portion 301 and the notch portion 303 of the capacitance line 300 are formed wider than that of the scanning line 3a (FIG. 2), and the capacitance line 300 is disposed between the semiconductor layer 1a of the TFT 30 and the data line 6a (FIG. 3).

Furthermore, in the present embodiment, the capacitance line 300 has an aluminum layer 300a as an upper layer thereof, and a polysilicon layer 300b as a lower layer thereof. Accordingly, the above effect can be more effectively exhibited.

Firstly, since the upper layer of the capacitance line 300 is made of the aluminum layer 300a, the upper layer can attain higher electrical conductivity. That is, in the embodiment, the lower resistance of the capacitance line 300 is also supported by this multilayered structure.

Furthermore, since the lower layer of the capacitance line 300 is made of the polysilicon layer 300b, for instance, the so-called stray light that is generated by reflecting a light at a lower surface of the data line 6a after the light enters into the electro-optic device according to the embodiment can be inhibited in advance from reaching the TFT 30. It is because an entirety or part of such stray light can be absorbed by the lower surface of the capacitance line 300.

In addition to the above, the capacitance line 300 in the embodiment is formed so that the periphery 302p of the projection 302 and the periphery 301p of the body line portion 301 may overlap with the periphery 9ap of the pixel electrode 9a (hereinafter, in some cases, it may be simply expressed as "the capacitance line 300 overlaps with the pixel electrode 9a"). Accordingly, also thereby, light can be inhibited from entering the TFT 30. In addition, in the embodiment, as mentioned above, the periphery 6ap of the data line 6a and the periphery 3ap of the scanning line 3a are formed so as not to overlap with the periphery 9ap of the pixel electrode 9a. This is enabled by forming the capacitance line 300 so as to overlap with the pixel electrode 9a. That is, in the related art device, the data line 6a and the scanning line 3a are formed so as to overlap with the pixel electrode 9a, and thereby an incident light is expected to be shielded. However, in the present embodiment, the capacitance line 300 is formed so as to overlap with the pixel electrode 9a, accordingly there is no need of the above-mentioned configuration. As a result, since a parasite capacitance that is generated due to overlap of the data line 6a and the scanning line 3a with the pixel electrode 9a can be reduced, the potential fluctuation of the data line 6a and the scanning line 3a can be inhibited in advance from adversely affecting on the potential of the pixel electrode 9a.

From the above, according to the electro-optic device according to the embodiment, due to the lower resistance of the capacitance line, and furthermore due to the decrease of the occurrence of the light leakage current in the thin film transistor, an image of high quality can be displayed.

Figure 4:
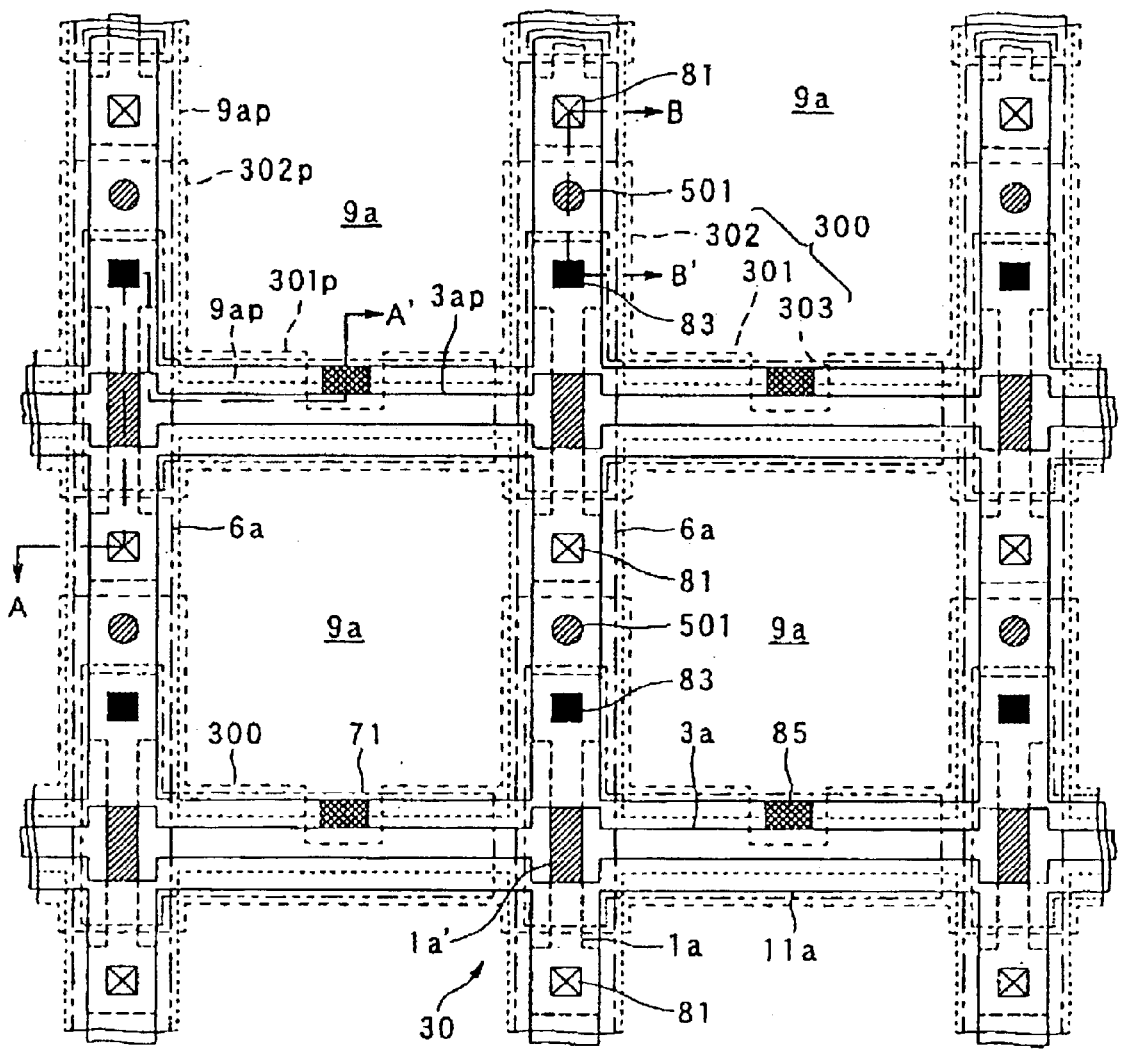
FIG. 4 is a plan view showing one exemplary embodiment of a capacitance line different from that shown in FIG. 2.
Figure 4:
Figure 5:
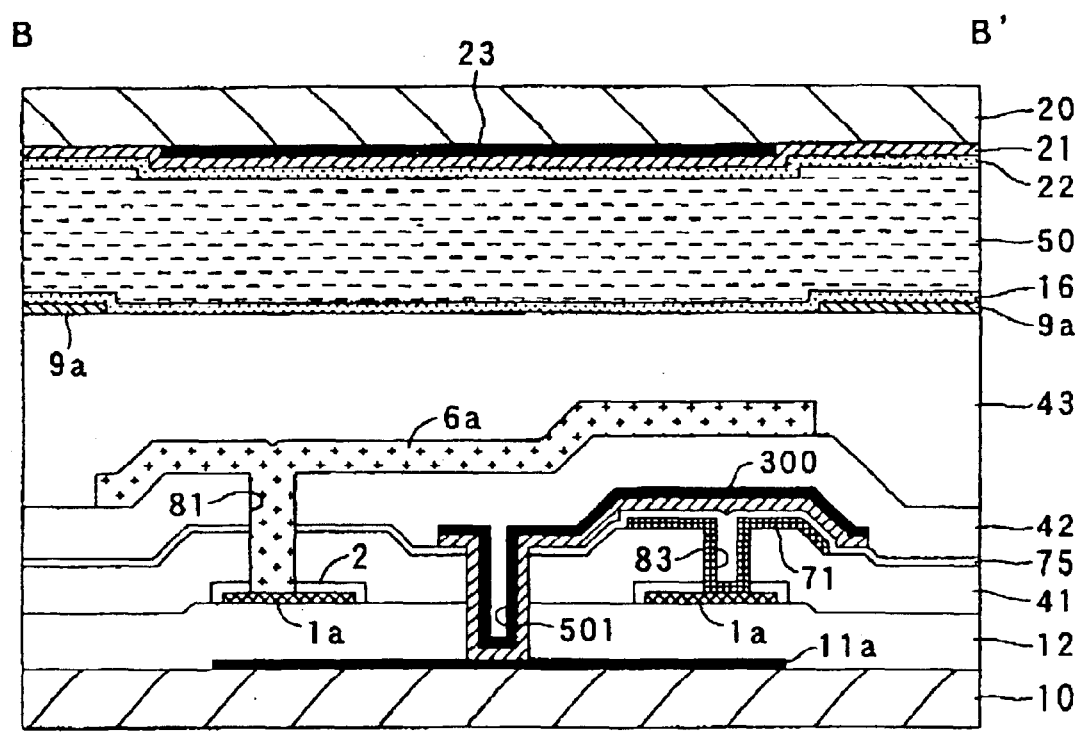
FIG. 5 is a sectional view taken along plane B-B' of FIG. 4.

As the embodiment of the present invention, other than the above, an embodiment shown in FIGS. 4 and 5 can be realized. FIG. 4 is a plan view showing an exemplary embodiment that is different from FIG. 2 in that the capacitance line 300 is provided with a contact hole 501. FIG. 5 is a sectional view taken along plane B-B' of FIG. 4.

In FIGS. 4 and 5, there is no change in that a width of the projection 302 of the capacitance line 300 is formed wider than that of the data line 6a, widths of the body line portion 301 and the notch portion 303 are formed wider than that of the scanning line 3a, the capacitance line 300 is formed in a multi-layered structure. However, the present exemplary embodiment is different from the above in that the capacitance line 300 and the lower side light shielding film 11a are electrically connected through the contact hole 501.

The contact hole 501, as shown in FIG. 5, is disposed so as to penetrate through the first interlayer insulating film 41 and the primary insulating film 12. Furthermore, the contact hole 501, as shown two-dimensionally in FIG. 4, is formed in the neighborhood of a tip end portion of the projection 302 of the capacitance line 300. Furthermore, the contact hole 501, as shown in FIGS. 4 and 5, is formed immediately below the data line 6a. Thereby, since the contact hole 501 is formed within a non-open region provided by the data line 6a, the open area ratio can be further enhanced.

In such an exemplary embodiment, an operational effect according to the lower resistance of the capacitance line 300 can be more assuredly attained, because an electrically connected lower light shielding layer 11a can exhibit a substitute operation thereof, even when some kind damage is inflicted on part of the capacitance line 300. The substitute operation here means complementing a damaged position of the capacitance line 300, the lower side light shielding film 11a realizes a supply of a fixed potential to the fixed potential side capacitance electrode contained in the capacitance line 300. From these, resultantly, the higher resistance of the capacitance line 300 itself is not caused.

Since the lower side light shielding film 11a in the present exemplary embodiment, as mentioned above, is extended in lattice pattern below the scanning line 3a and the data line 6a and along the scanning line 3a and the data line 6a, many electrical conduction paths can be expected to function even when the lower side light shielding film 11a is partially damaged due to some reason. Accordingly, when the capacitance line 300 is viewed as a whole, a situation where the capacitance line is made higher in resistance is even more difficult to be caused.

(Second Exemplary Embodiment)

Figure 6:
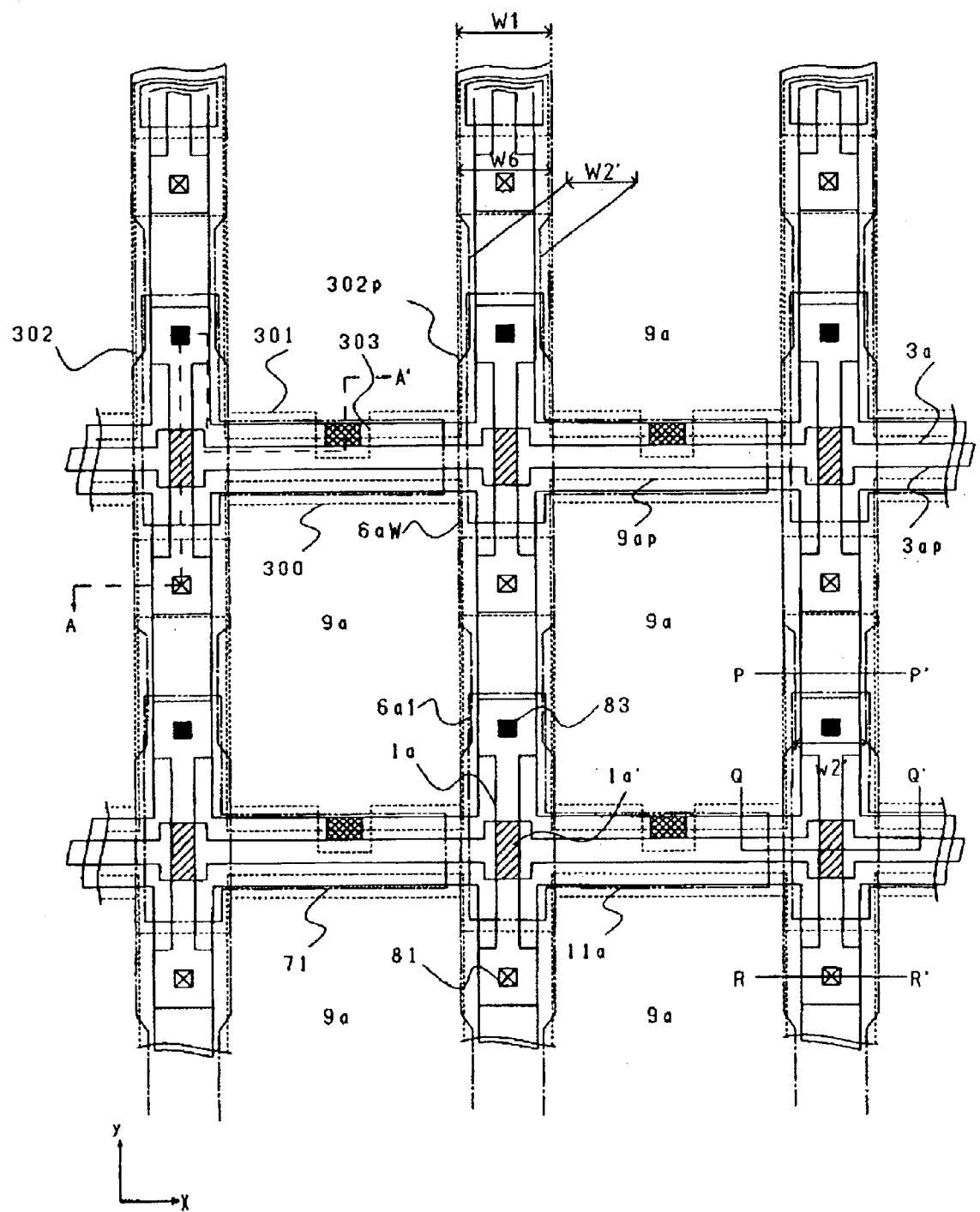
FIG. 6 is a plan view showing one exemplary embodiment of a data line different from that shown in FIG. 2.
Figure 7:
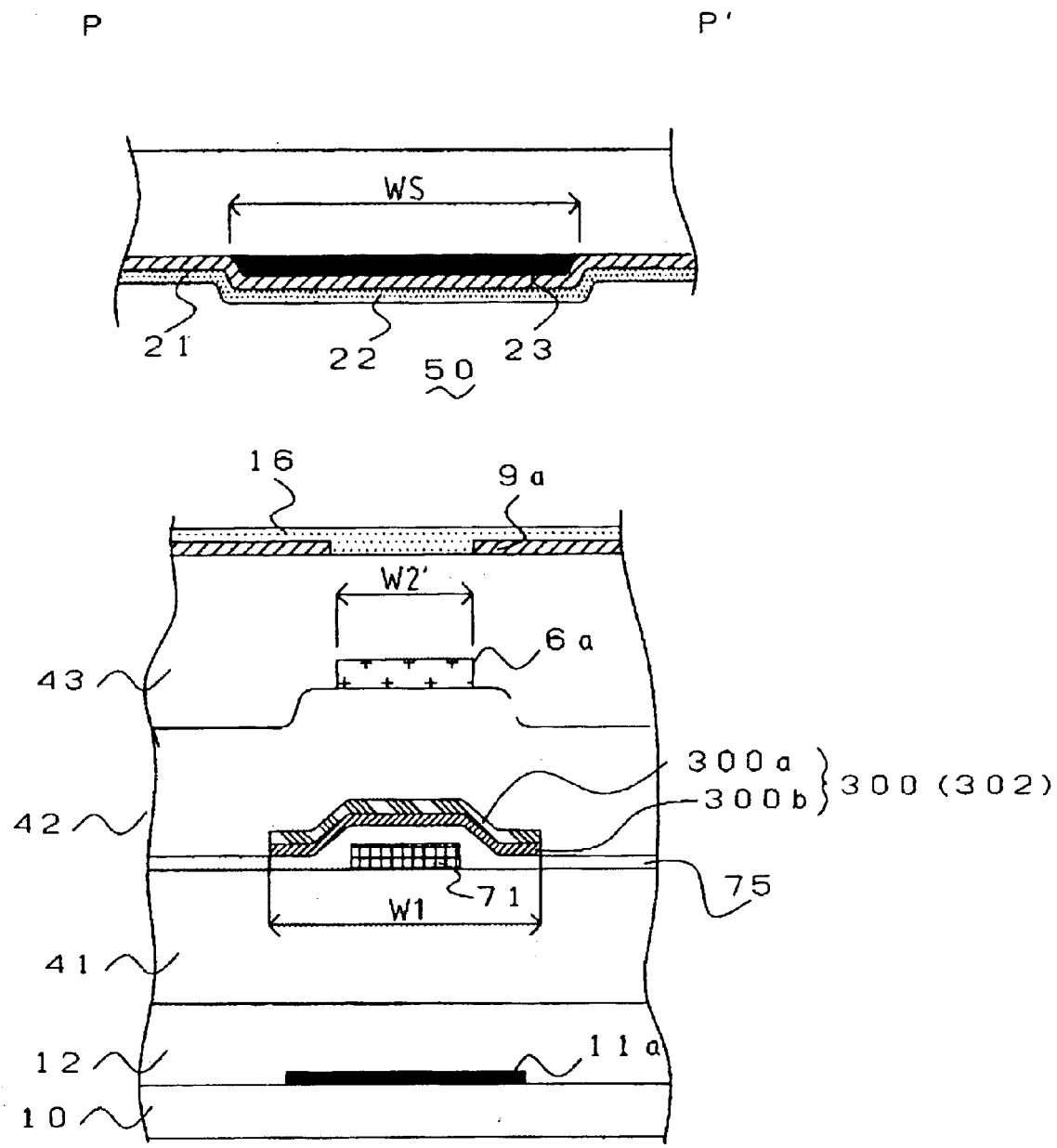
FIG. 7 is a sectional view taken along plane P-P' of FIG. 6.
Figure 8:
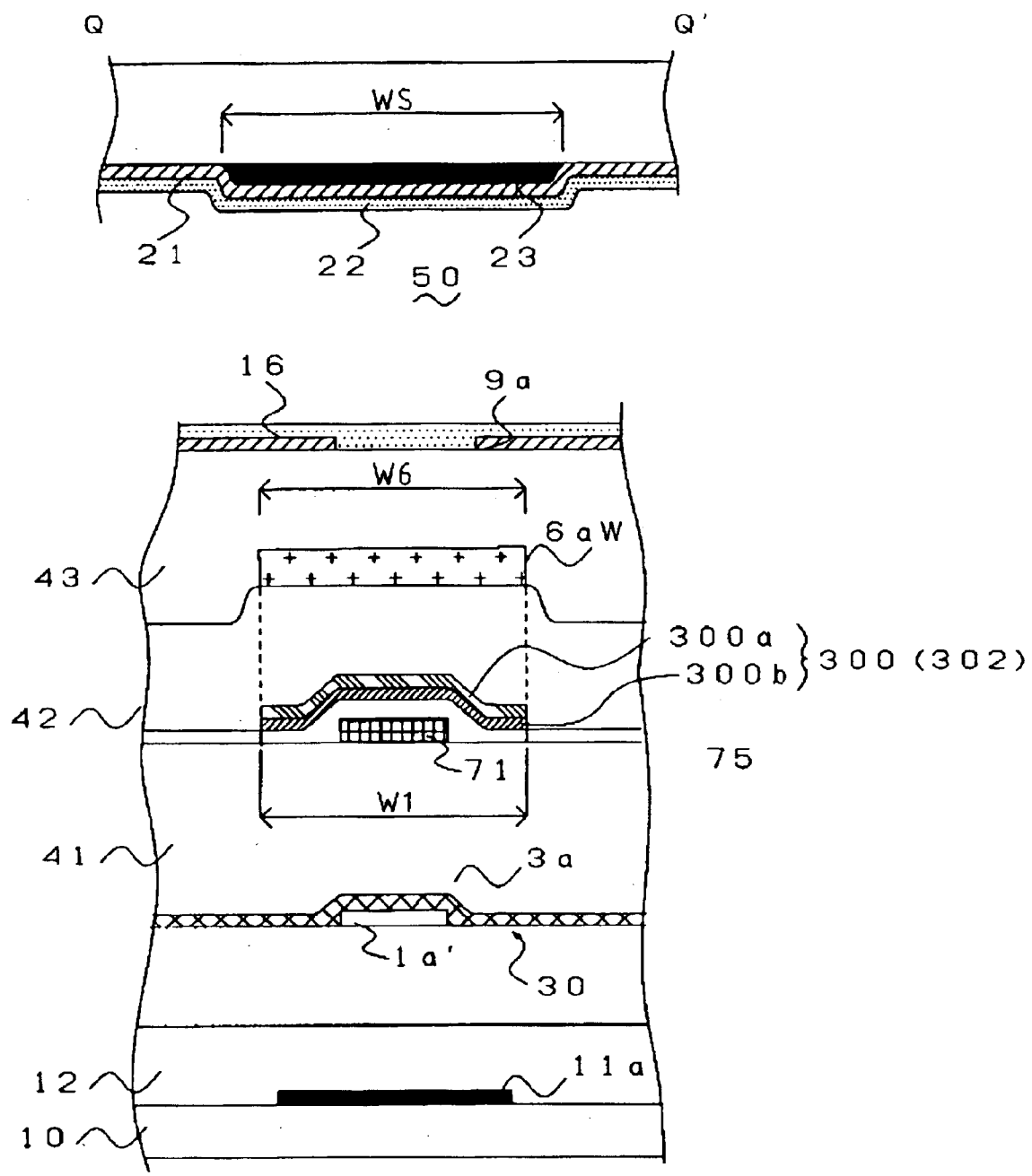
FIG. 8 is a sectional view taken along plane Q-Q' of FIG. 6.
Figure 9:
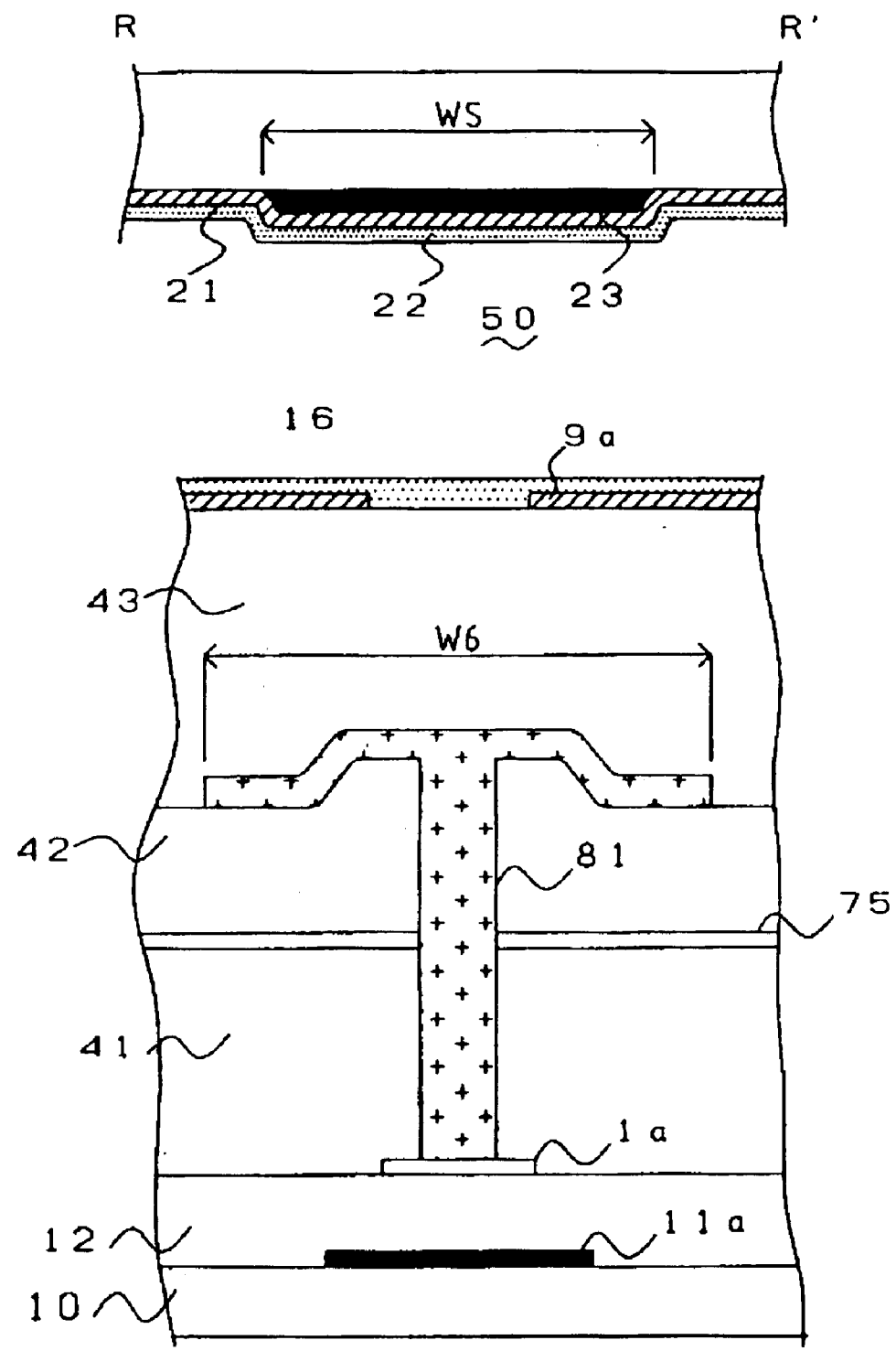
FIG. 9 is a sectional view taken along plane R-R' of FIG. 6.

In the following, a second exemplary embodiment of the present invention is explained with reference to FIGS. 6 through 9. FIG. 6 is a schematic showing an exemplary embodiment having a data line that is different from that of FIG. 2. FIG. 7 is a sectional view taken along plane P-P' of FIG. 6, FIG. 8 is a sectional view taken along plane Q-Q' of FIG. 6, and FIG. 9 is a sectional view taken along plane R-R' of FIG. 6. Since a principal configuration and operations of the electro-optic device according to the second exemplary embodiment are similar to those of the first exemplary embodiment, in the following, characteristic portions in the second embodiment are mainly explained. In addition, reference numerals that are the same as those used in FIGS. 1 through 5 will be used as reference numerals in FIGS. 6 through 9, when substantially the same element is indicated.

In the second exemplary embodiment, as shown in FIGS. 6 through 9, a data line 6a1 is provided with a wider portion 6aW that is formed wider locally in a portion that overlaps with a TFT 30. A portion that extends along the data line 6a1 in the capacitance line 300, that is, a width W1 of a projection 302 is, firstly, formed wider than a width W2' of a portion other than the wider portion 6aW in the data line 6a1 (FIG. 7, in particular). This point is substantially the same as FIG. 2 of the first exemplary embodiment. Secondly, the width W1 of the projection 302 is formed substantially the same as a width W6 of the wider portion 6aW in the data line 6a1 (FIG. 8). This is a characteristic point based on that the data line 6a1 has the wider portion 6aW newly in the second embodiment, and cannot be found in FIG. 2 of the first exemplary embodiment.

Specific values of the width W1 of the projection 302, the width W6 of the wider portion 6aW in the data line 6a1 and the width W2' of other than the wider portion 6aW, may be set at 3 μm, 3 μm, and 2 μm, respectively.

Furthermore, in the second exemplary embodiment, as shown in FIG. 6 or FIGS. 8 and 9, the wider portion 6aW of the data line 6a1, is formed continuously from a portion that overlaps with the TFT 30 up to a portion where the contact hole 81 that connects the semiconductor layer 1a of the TFT 30 and the data line 6a is disposed for each of the TFTs 30 arranged in matrix.

In addition, in the second exemplary embodiment, as shown in FIGS. 7 through 9, a light shielding film 23 is formed on the opposite substrate 20. A width WS of the light shielding film 23 is formed wider than that of the wider portion 6aW.

In the electro-optic device of the second exemplary embodiment thus configured, the following operational effects can be expected. That is, firstly, since the wider portion 6aW of the data line 6a1 and the projection 302 of the capacitance line 300, both of which are formed wider, are present above the TFT 30, a "double light shielding operation" can be obtained. Accordingly, since a light incident onto the channel region 1a' of the TFT 30 can be generated with further difficulty than the aforementioned exemplary embodiment, the light leakage current is also generated with difficulty.

In particular, in the second embodiment, above the TFT 30, overlapping with such capacitance line 300, the wider portion 6aW of the data line 6a is also present. In this case, on the TFT 30, the light shielding performance corresponding to a multiplied value of the transmittances of these can be obtained.

Thus, in the second exemplary embodiment, even when there are some situations that may deteriorate the light shielding performance thereof in the capacitance line 300, the data line 6a complementarily exhibits the light shielding performance. Accordingly, light incident onto the TFT 30 is generated with further difficulty.

Secondly, further relating to such excellent light shielding performance, in the second exemplary embodiment, as mentioned above, the width W1 of the projection 302 of the capacitance line 300 and the width W6 of the wider portion 6aW of the data line 6a are formed narrower than the width WS of the light shielding film 23 on the opposite substrate 20 (that is, WS>W1, WS>W6). According to this, a light that is incident from above the TFT 30 is first blocked by the light shielding film 23, or, if it should transmit therethrough, would be blocked by the wider portion 6aW of the subsequent data line 6a. Furthermore, even when the incident light should transmit through the wider portion 6aW, it would be blocked by the projection 302 of the subsequent capacitance line 300. To put it briefly, in the second exemplary embodiment, triple light shielding performance can be realized. Accordingly, light incident onto the TFT 30 is generated with further difficulty.

Thirdly, in the second exemplary embodiment, the wider portion 6aW of the data line 6a is formed continuously from a portion that overlaps with the TFT 30 up to the contact hole 81 for each of the TFTs 30 arranged in matrix. Since the contact hole 81, as mentioned above, is disposed to connect the semiconductor layer 1a of the TFT 30 and the data line 6a, the capacitance line 300 cannot be formed in this portion. That is, the light shielding performance of the capacitance line 300 cannot be expected at the contact hole 81.

However, in the second embodiment, in the formation site of the contact hole 81, similarly to the above of the TFT 30, there is the wider portion 6aW of the data line 6a. Accordingly, the deterioration of the light shielding performance sufferable when the capacitance line 300 cannot be formed can be compensated by the presence of the wider portion 6aW. As in the second exemplary embodiment, according to an exemplary embodiment in which the wider portions 6a above the TFT 30 and the formation site of the contact hole 81 are formed so as to continue, there is no need to needlessly expand the formation site of the wider portion 6aW. Accordingly, the exemplary embodiment is preferable from a viewpoint of not increasing an internal reflection.

As mentioned above, in the second embodiment, by coupling various kinds of operational effects, the likelihood of a light entering the channel region 1a' is largely reduced. Accordingly, the generation of the light leakage current in the TFT 30, and the occurrence of the flicker on an image resultant from the light leakage current can be largely reduced or suppressed.

In the second exemplary embodiment, the width W6 of the wider portion 6aW of the data line 6a1 is regarded as the same as that W1 of the projection 302 of the capacitance line 300. However, the present invention is not restricted to this exemplary embodiment. Other than this, for instance, the width of the wider portion 6aW of the data line can be preferably formed narrower than that of the projection 302 of the capacitance line 300. According to such an exemplary embodiment, in addition to the fact that the double light shielding operation due to the wider portion 6aW and the projection 302 can be obtained almost equal with the above, since the wider portion 6aW is relatively narrowly formed, an internal reflection of a light in the wider portion 6aW is not needlessly caused, resulting in inhibiting an increase of the stray light from occurring.

As the light reflected internally in the wider portion 6aW, the following types of light can be considered, such as stray light that is generated when an incident light is reflected by some elements in the electro-optic device, return light that returns again to the electro-optic device after a light once exited from the electro-optic device is reflected by some elements outside of the electro-optic device, or return light that a light exited from the other electro-optic device returns to the electro-optic device in a projection type display device (described below with FIG. 12), such as a color displayable liquid crystal projector in which a plurality of sets of the electro-optic device is disposed.

(Entire Configuration of Electro-Optic Device)

Figure 10:
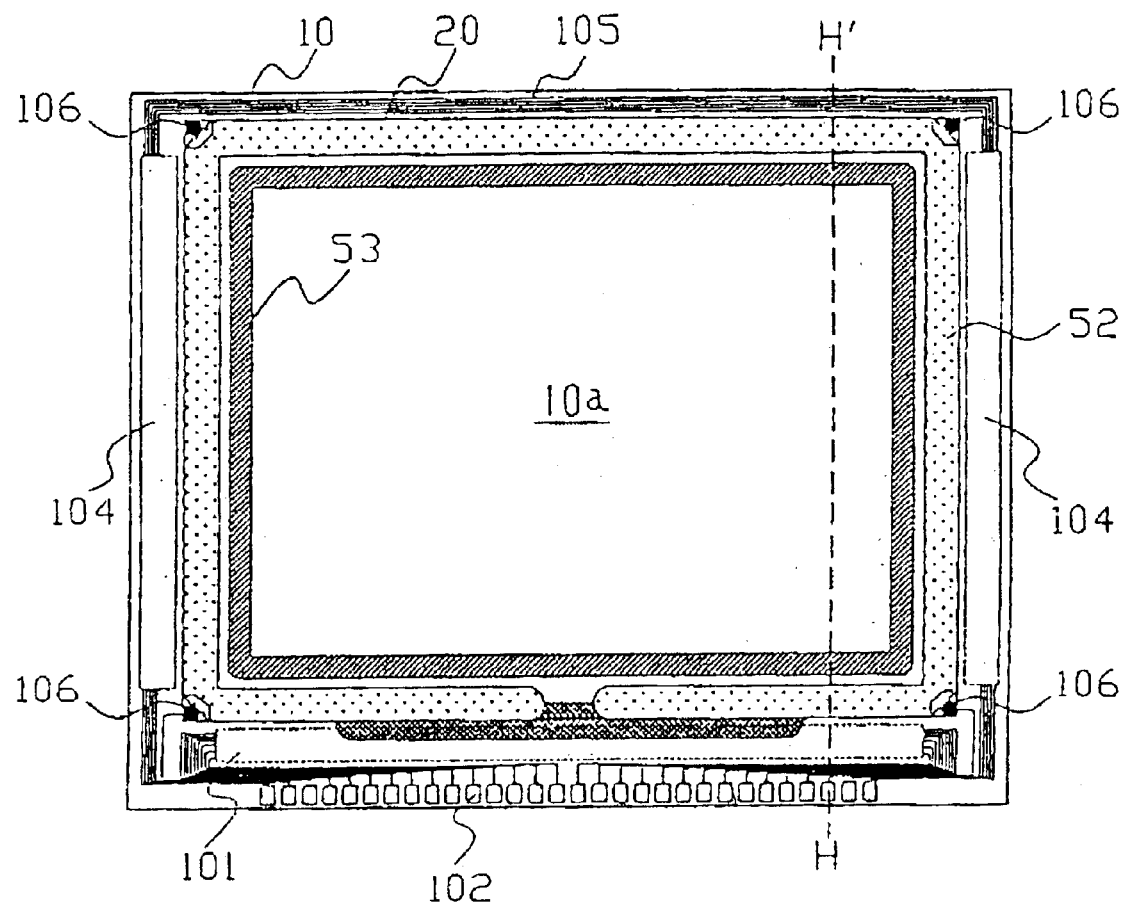
FIG. 10 is a plan view when a TFT array substrate in the electro-optic device according to an embodiment of the present invention is viewed together with respective constituent elements formed thereon from an opposite substrate side.

An entire configuration of an electro-optic device thus configured according to the present embodiment is explained with reference to FIGS. 10 and 11. FIG. 10 is a plan view of a TFT array substrate 10 and various constituent elements formed thereon viewed from an opposite substrate 20 side, and FIG. 11 is a sectional view taken along plane H-H' of FIG. 10.

Figure 11:
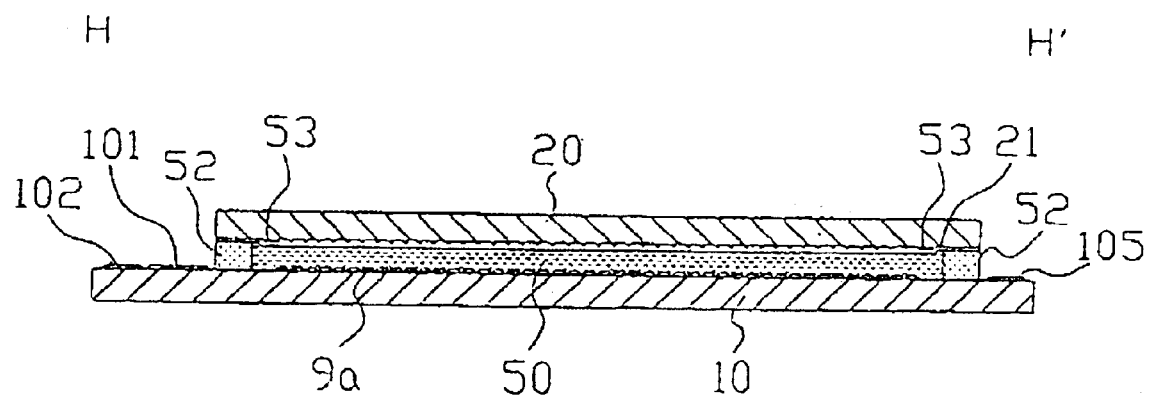
FIG. 11 is a sectional view taken along plane H-H' of FIG. 10.

In FIGS. 10 and 11, in the electro-optic device according to the present embodiment, the TFT array substrate 10 and the opposite substrate 20 are disposed facing each other. Between the TFT array substrate 10 and the opposite substrate 20, a liquid crystal layer 50 is filled in, and the TFT array substrate 10 and the opposite substrate 20 are mutually adhered with a sealing material 52 disposed in a seal region located in a circumference of an image display region 10a.

In a region outside of the sealing material 52, a data line driving circuit 101 that drives the data line 6a by supplying an image signal to the data line 6a at a predetermined timing and external circuit connection terminals 102 are arranged along one side of the TFT array substrate 10. Scanning line driving circuits 104 that drive scanning lines 3a by supplying scanning signals to the scanning lines 3a at a predetermined timing are disposed along two sides adjacent to the above-mentioned one side.

When there is no problem of delaying the scanning signal supply to the scanning line 3a, the scanning line driving circuit 104 may be disposed only on one side. Furthermore, the data line driving circuit 101 may be disposed on both sides of the image display region 10a.

In a remaining side of the TFT array substrate 10, a plurality of wirings 105, which connects between the scanning line driving circuits 104 disposed on both sides of the image display region 10a, is disposed. Furthermore, in at least one of the corner portions of the opposite substrate 20, a conductive material 106, which establishes an electrically continuation between the TFT array substrate 10 and the opposite substrate 20, is disposed. As shown in FIG. 11, the opposite substrate 20 that has a contour substantially same as that of the sealing material 52 shown in FIG. 10 is fixed to the TFT array substrate 10 with the sealing material 52.

In FIG. 11, on the TFT array substrate 10, an orientation film is formed on pixel electrodes 9a thereon the pixel switching TFTs 30 and wirings, such as the scanning lines 3a and the data lines 6a are formed. On the other hand, on the opposite substrate 20, other than an opposite electrode 21, an orientation film is formed on an uppermost layer portion beneath 21. Furthermore, the liquid crystal layer 50 is made of a liquid crystal in which for instance one kind or more nematic liquid crystals are mixed, and takes a predetermined orientation state between the pair of orientation films.

On the TFT array substrate 10, in addition to the data line driving circuit 101, the scanning line driving circuits 104, a sampling circuit that supplies image signals to a plurality of data lines 6a at predetermined timings, a precharge circuit that supplies a precharge signal of a predetermined voltage level in advance of the image signals to each of the plurality of data lines 6a, and an inspection circuit for inspecting quality, defects of the electro-optic devices during the production and at the shipment thereof may be formed.

(Embodiment of Electronic Instrument)

Figure 12:
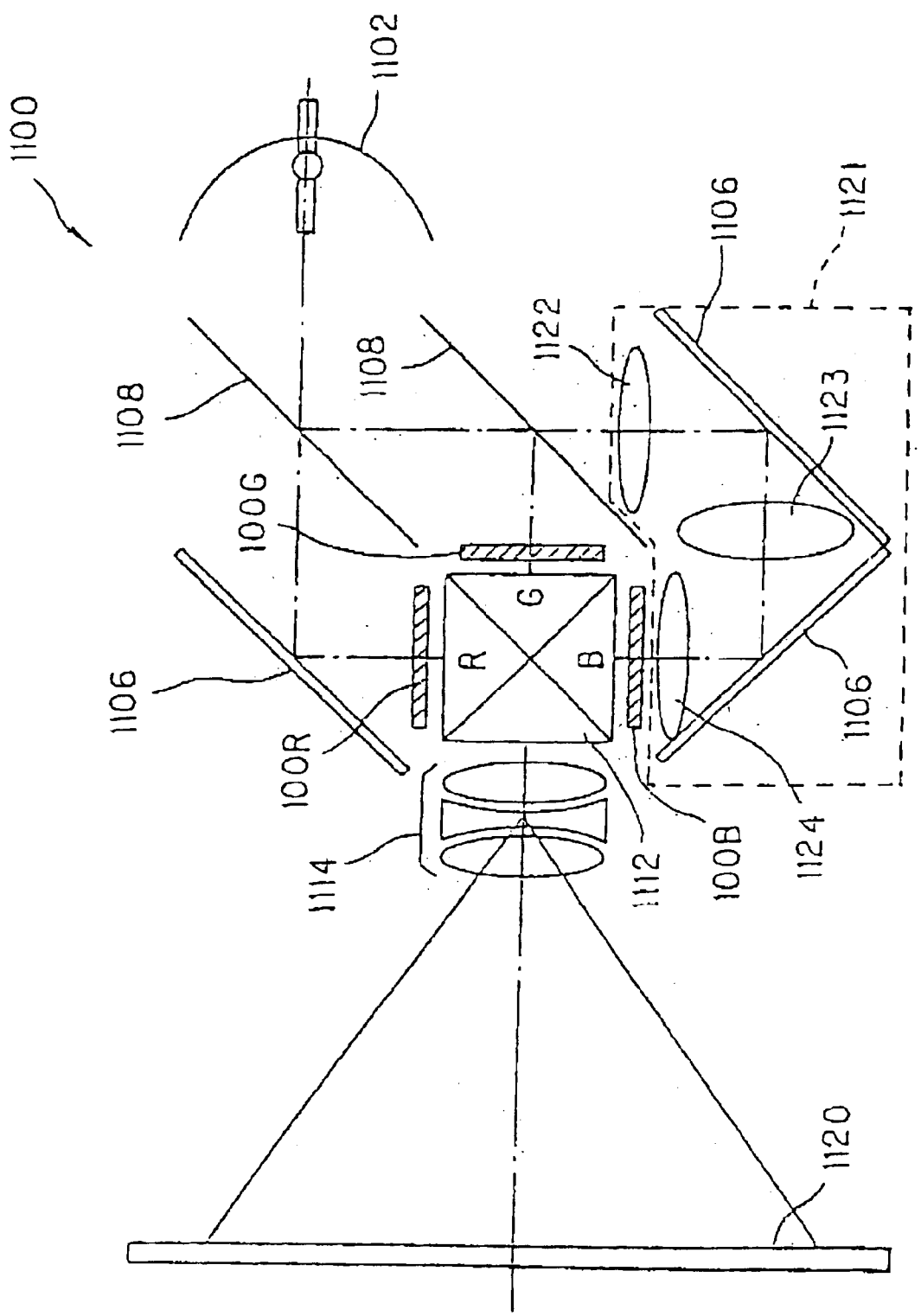
FIG. 12 is a schematic sectional view showing a color liquid crystal projector that is an example of a projection type color display device that is an exemplary embodiment of an electro-optic device of the present invention.

An entire configuration, and, in particular, an optical configuration of an embodiment of a projection type color display device that is an example of an electronic instrument in which the electro-optic device that is detailed in the above is used as a light valve will be explained. FIG. 12 is a schematic sectional view of a projection type color display device.

In FIG. 12, in a liquid crystal projector 1100 that is an example of a projection type color display device in the present embodiment, three of electro-optic device whose driving circuit is mounted on a TFT array substrate are used as light valves 100R, 100G and 100B for RGB, respectively. In the liquid crystal projector 1100, a projection light that is emitted from a lamp unit 1102 of a white light source, such as a metal halide lamp, is separated, by use of three mirrors 1106 and two dichroic mirrors 1108, into light components R, G and B corresponding to three primary colors RGB, and the separated color components R, G and B, respectively, are guided to light valves 100R, 100G and 100B corresponding to the respective colors. At this time, in particular, the B light, in order to inhibit light loss due to a long light path from occurring, is guided through a relay lens unit 1121 made of an entrance lens 1122, a relay lens 1123 and an exit lens 1124. Then, light components corresponding to three primary colors that are modulated by the light valves 100R, 100G and 100B, respectively, are compounded again by use of a dichroic prism 1112, and thereafter are projected through a projection lens 1114 onto a screen 1120 as a color image.

The present invention is not restricted to the above exemplary embodiments, can be appropriately altered in any way that is not contrary to the gist or spirit of the invention that can be read from scope of claims and an entire specification, or ideas, and electro-optic devices accompanying such alterations, for instance, electrophoresis apparatus and an electroluminescent display device, and an electronic instrument including these electro-optic devices are also contained in a technical scope of the present invention.

What is claimed is:

1. An electro-optic device, comprising:

a substrate, a scanning line above the substrate;

a data line above the substrate;

a thin film transistor disposed in correspondence with an intersection of the scanning line and the data line;

a pixel electrode disposed in correspondence with the thin film transistor;

a pixel potential side capacitance electrode that is electrically connected to the pixel electrode and constitutes a storage capacitor; and a dielectric film;

a capacitance line that contains a fixed potential side capacitance electrode that is oppositely disposed via the dielectric film to the pixel potential side capacitance electrode and constitutes the storage capacitor;

the capacitance line including a body line portion that extends along the scanning line and a portion that extends along the data line; and a width of a portion that extends along the data line in the capacitance line being formed at least as wide as the data line.

2. The electro-optic device according to claim 1, a periphery of a portion that extends along the data line in the capacitance line overlapping two-dimensionally with a periphery of the pixel electrode; and at least a part of a periphery of the data line not overlapping two-dimensionally with a periphery of the pixel electrode.

3. The electro-optic device according to claim 1, the capacitance line being, as a portion that extends along the data line, provided with a projection that projects along the data line from the body line portion; and a width of the projection being formed at least as wide as the data line.

4. The electro-optic device according to claim 1, a width of the body line portion in the capacitance line being formed wider than the scanning line.

5. The electro-optic device according to claim 4, a periphery of the body line portion in the capacitance line overlapping two-dimensionally with a periphery of the pixel electrode; and at least a part of a periphery of the scanning line not overlapping two-dimensionally with a periphery of the pixel electrode.

6. The electro-optic device according to claim 1, the capacitance line being disposed in a laminate position between a semiconductor layer that constitutes the thin film transistor and the data line.

7. The electro-optic device according to claim 6, a plurality of the pixel electrodes being formed in matrix on the substrate; and the capacitance line being electrically connected to a lower side light shielding film that is disposed below the thin film transistor and extending in lattice pattern along the scanning line and the data line.

8. The electro-optic device according to claim 1, the capacitance line having a notch portion, two dimensionally, corresponding to a formation site of a contact hole that connects the pixel electrode and the pixel potential side capacitance electrode.

9. The electro-optic device according to claim 1, the capacitance line being formed of a multi-layered film.

10. The electro-optic device according to claim 9, the capacitance line having a film made of a conductive material as an upper layer thereof and a film made of a light absorbing material as a lower layer thereof.

11. The electro-optic device according to claim 1, the data line being formed wider locally in a portion that overlaps with the thin film transistor; and a width of a portion that extends along the data line in the capacitance line being formed wider than a width of a portion that is not formed wider in the data line, and being formed to have the same width as a portion that is formed wider in the data line.

12. The electro-optic device according to claim 1, the data line being formed wider locally in a portion that overlaps with the thin film transistor; and a width of a portion that extends along the data line in the capacitance line being formed wider than a width of a portion that is not formed wider in the data line, and being formed narrower than a portion that is formed wider in the data line.

13. The electro-optic device according to claim 11, the capacitance line being disposed in a laminate position between the thin film transistor and the data line; and the data line being formed wider in a portion where a contact hole for use in connection with the thin film transistor is disposed, in addition to a portion that overlaps with the thin film transistor.

14. The electro-optic device according to claim 11, the data line being formed wider continuously from a portion that overlaps with the thin film transistor to a portion where the contact hole is disposed for each of the thin film transistors.

15. The electro-optic device according to claim 1, further comprising:

another substrate disposed opposite via an electro-optic material to the substrate; and a light shielding film formed on the another substrate;

a width of the data line and a portion that extends along the data line in the capacitance line being formed narrower than the light shielding film.

16. The electro-optic device according to claim 1, the width of the portion that extends along the data line in the capacitance line being formed wider than the width of the data line.

17. An electronic instrument, comprising:

an electro-optic device that includes:
  a substrate;
  a scanning line above the substrate;
  a data line above the substrate;
  a thin film transistor disposed in correspondence with an intersection of the scanning line and the data line;
  a pixel electrode disposed in correspondence with the thin film transistor;
  a pixel potential side capacitance electrode that is electrically connected to the pixel electrode and constitutes a storage capacitor;
  a dielectric film; and
  a capacitance line that contains a fixed potential side capacitance electrode that is oppositely disposed via the dielectric film to the pixel potential side capacitance electrode and constitutes the storage capacitor;
  the capacitance line including a body line portion that extends along the scanning line and a portion that extends along the data line; and
  a width of a portion that extends along the data line in the capacitance line being formed at least as wide as the data line.

* * * * *